United States Patent
Liu et al.

(10) Patent No.: US 11,520,570 B1
(45) Date of Patent: Dec. 6, 2022

(54) APPLICATION-SPECIFIC HARDWARE PIPELINE IMPLEMENTED IN AN INTEGRATED CIRCUIT

(71) Applicant: Xilinx, Inc., San Jose, CA (US)

(72) Inventors: Dan Liu, Beijing (CN); Gai Liu, Santa Clara, CA (US); Luciano Lavagno, Berkeley, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 17/344,472

(22) Filed: Jun. 10, 2021

(51) Int. Cl.
  *G06F 9/45* (2006.01)
  *G06F 8/41* (2018.01)
  *G06F 8/20* (2018.01)

(52) U.S. Cl.
  CPC .............. *G06F 8/4452* (2013.01); *G06F 8/20* (2013.01)

(58) Field of Classification Search
  CPC ................................ G06F 8/4452; G06F 8/20
  USPC ................................................... 717/160, 159
  See application file for complete search history.

(56) References Cited

U.S. PATENT DOCUMENTS

| | | | | |
|---|---|---|---|---|
| 4,812,970 A * | 3/1989 | Kitamura | ............... | G06F 9/3867 712/E9.008 |
| 6,848,100 B1 * | 1/2005 | Wu | ..................... | G06F 11/3612 717/133 |
| 6,952,816 B2 * | 10/2005 | Gupta | ..................... | G06F 30/30 716/108 |
| 7,134,120 B2 | 11/2006 | Hammes | | |
| 7,219,342 B2 | 5/2007 | Metzgen | | |
| 7,412,684 B2 | 8/2008 | Gutberlet et al. | | |
| RE40,925 E | 9/2009 | Ly et al. | | |
| 7,739,657 B2 * | 6/2010 | Rolfs | .................... | G06F 9/4806 719/314 |
| 7,777,980 B2 * | 8/2010 | Hutchins | .......... | G11B 20/10037 375/376 |
| 7,823,117 B1 * | 10/2010 | Bennett | ................... | G06F 30/34 716/128 |
| 8,086,832 B2 * | 12/2011 | Lichtensteiger | ...... | G06F 1/3237 718/107 |
| 8,443,344 B1 * | 5/2013 | Sundararajan | .......... | G06F 30/34 717/136 |
| 9,477,577 B2 * | 10/2016 | Baca | .................... | G06F 11/3624 |

(Continued)

OTHER PUBLICATIONS

Title: A graph-based iterative compiler pass selection and phase ordering approach; author: R Nobre, published on 2016.*

(Continued)

*Primary Examiner* — Chameli Das
(74) *Attorney, Agent, or Firm* — Kevin T. Cuenot

(57) ABSTRACT

Controlling execution of application-specific hardware pipelines includes detecting, using computer hardware, a loop construct contained in a function within a design specified in a high-level programming language, extracting, using the computer hardware, the loop construct from the function into a newly generated function of the design, and generating, using the computer hardware, a state transition graph corresponding to the loop construct. The state transition graph can be pruned by relocating operations from the function entry state and the function exit state into the loop region. A circuit design defining, at least in part, a pipeline hardware architecture implementing the loop construct can be generated using the computer hardware based, at least in part, on the pruned state transition graph.

18 Claims, 9 Drawing Sheets

(56) References Cited

U.S. PATENT DOCUMENTS

| | | | |
|---|---|---|---|
| 10,778,501 B2* | 9/2020 | Rao | H04L 43/12 |
| 2009/0327674 A1* | 12/2009 | Codrescu | G06F 9/325 |
| | | | 712/241 |
| 2017/0039048 A1* | 2/2017 | Gschwind | G06F 8/452 |

OTHER PUBLICATIONS

Title: Graph convolution over pruned dependency trees improves relation extraction, author: Y Zhang,, published on 2018.*
Title: Compact architecture for high-throughput regular expression matching on FPGA, author: YHE Yang, Published on 2008.*
Title: Designing modular hardware accelerators in C with ROCCC 2.0; author: J Villarreal, Published on 2010.*

* cited by examiner

|   | State 2 | State 3 | State 4 |
|---|---------|---------|---------|
| 1 | LI3 | LI2 | LI1 |
| 2 | LI4 | LI3 | LI2 |
| 3 | ✗ | LI4 (Exit) | LI3 |

APPLICATION-SPECIFIC HARDWARE PIPELINE IMPLEMENTED IN AN INTEGRATED CIRCUIT

TECHNICAL FIELD

This disclosure relates to integrated circuits (ICs) and, more particularly, to implementing an application-specific hardware pipeline in an IC.

BACKGROUND

High-Level Synthesis (HLS) refers to a technology that converts a design specified in a high-level programming language, e.g., as source code, into a circuit design specified in a hardware description language. The circuit design may then be realized within an integrated circuit (IC). In one aspect, the IC may be a programmable IC. In generating the circuit design, particular programming constructs of the high-level programming language such as loops lend themselves to hardware pipelining. Recognizing loop constructs and such constructs as hardware pipelines can increase the data throughput and performance of the resulting hardware. As such, hardware pipelining is an important design technique for generating high-performance circuit designs in HLS.

A pipeline hardware architecture is typically designed to include a control circuit and a pipeline circuit. The control circuit and the pipeline circuit are designed in a manner that closely tracks the flow control of the loop construct and the data path execution of the original high-level programming language of the design. As a result, each pipeline hardware architecture is, in effect, an application-specific implementation of the loop construct having a customized control circuit. This process can be complex, time-consuming, and error prone.

SUMMARY

In one or more example implementations, a method can include detecting, using computer hardware, a loop construct contained in a function within a design specified in a high-level programming language, extracting, using the computer hardware, the loop construct from the function into a newly generated function of the design, and generating, using the computer hardware, a state transition graph corresponding to the loop construct. The state transition graph includes a function entry state, a loop region, and a function exit state. The method can include pruning, using the computer hardware, the state transition graph by relocating operations from the function entry state and the function exit state into the loop region. The method also can include generating, using the computer hardware, a circuit design defining a pipeline hardware architecture implementing the loop construct based, at least in part, on the pruned state transition graph.

A system includes a processor configured to initiate operations. The operations can include detecting a loop construct contained in a function within a design specified in a high-level programming language, extracting the loop construct from the function into a newly generated function of the design, and generating a state transition graph corresponding to the loop construct. The state transition graph includes a function entry state, a loop region, and a function exit state. The operations can include pruning the state transition graph by relocating operations from the function entry state and the function exit state into the loop region. The operations also can include generating a circuit design defining a pipeline hardware architecture implementing the loop construct based, at least in part, on the pruned state transition graph.

In another aspect, a computer program product includes one or more computer readable storage media, and program instructions collectively stored on the one or more computer readable storage media. The program instructions are executable by computer hardware to initiate operations. The operations can include detecting a loop construct contained in a function within a design specified in a high-level programming language, extracting the loop construct from the function into a newly generated function of the design, and generating a state transition graph corresponding to the loop construct. The state transition graph includes a function entry state, a loop region, and a function exit state. The operations can include pruning the state transition graph by relocating operations from the function entry state and the function exit state into the loop region. The operations also can include generating a circuit design defining a pipeline hardware architecture implementing the loop construct based, at least in part, on the pruned state transition graph.

This Summary section is provided merely to introduce certain concepts and not to identify any key or essential features of the claimed subject matter. Other features of the inventive arrangements will be apparent from the accompanying drawings and from the following detailed description.

BRIEF DESCRIPTION OF THE DRAWINGS

The inventive arrangements are illustrated by way of example in the accompanying drawings. The drawings, however, should not be construed to be limiting of the inventive arrangements to only the particular implementations shown. Various aspects and advantages will become apparent upon review of the following detailed description and upon reference to the drawings.

FIG. 7 illustrates example operations relating to flushing a pipeline region over a plurality of loop iterations of a loop execution.

DETAILED DESCRIPTION

This disclosure relates to integrated circuits (ICs) and, more particularly, to implementing an application-specific hardware pipeline in an IC. The IC may be a programmable IC. A design may be specified using a high-level programming language. An Electronic Design Automation (EDA) system is capable of processing the design to generate a hardware description of the design referred to herein as a circuit design. The design may include one or more loop constructs therein. The EDA system is capable of detecting such loop constructs within the design and generating hardware pipeline architecture(s) from portions of the design including the respective loop constructs. The hardware pipeline architecture(s) are defined in the resulting circuit design generated by the EDA system. The circuit design may be implemented in and/or using an IC thereby physically implementing or realizing the hardware pipeline architecture(s) in the IC.

In one or more example implementations, the EDA system is capable of generating a control circuit and a pipeline circuit forming the hardware pipeline architecture. The control circuit is capable of controlling operation of the pipeline circuit. In accordance with the inventive arrangements described within this disclosure, the EDA system creates the control circuit in a manner that is encapsulated and separate from the pipeline circuit. This means that the EDA system need not generate a customized control circuit for each different loop construct. The resulting control circuit is capable of providing a standardized interface to circuitry external to the pipeline hardware architecture and controlling the pipeline circuit via another standardized interface.

The EDA system generates the control circuit and the pipeline circuit to communicate using the standardized interfaces by implementing a predetermined and clearly defined set of control protocols. The set of control protocols define the signaling between the control circuit and the pipeline circuit. In one aspect, to provide a standardized interface between the control circuit and the pipeline circuit, the EDA system is capable of modifying the loop construct prior to generation of the circuit design.

In another aspect, the pipeline control circuit is capable of implementing a loop execution rewind functionality that exercises control over the pipeline circuit so that the next loop execution of the pipeline circuit may begin its first loop iteration before the previous loop execution completes. The control circuit may implement the loop execution rewind functionality by observing the state of selected signals in the set of control protocols.

Figure 1:
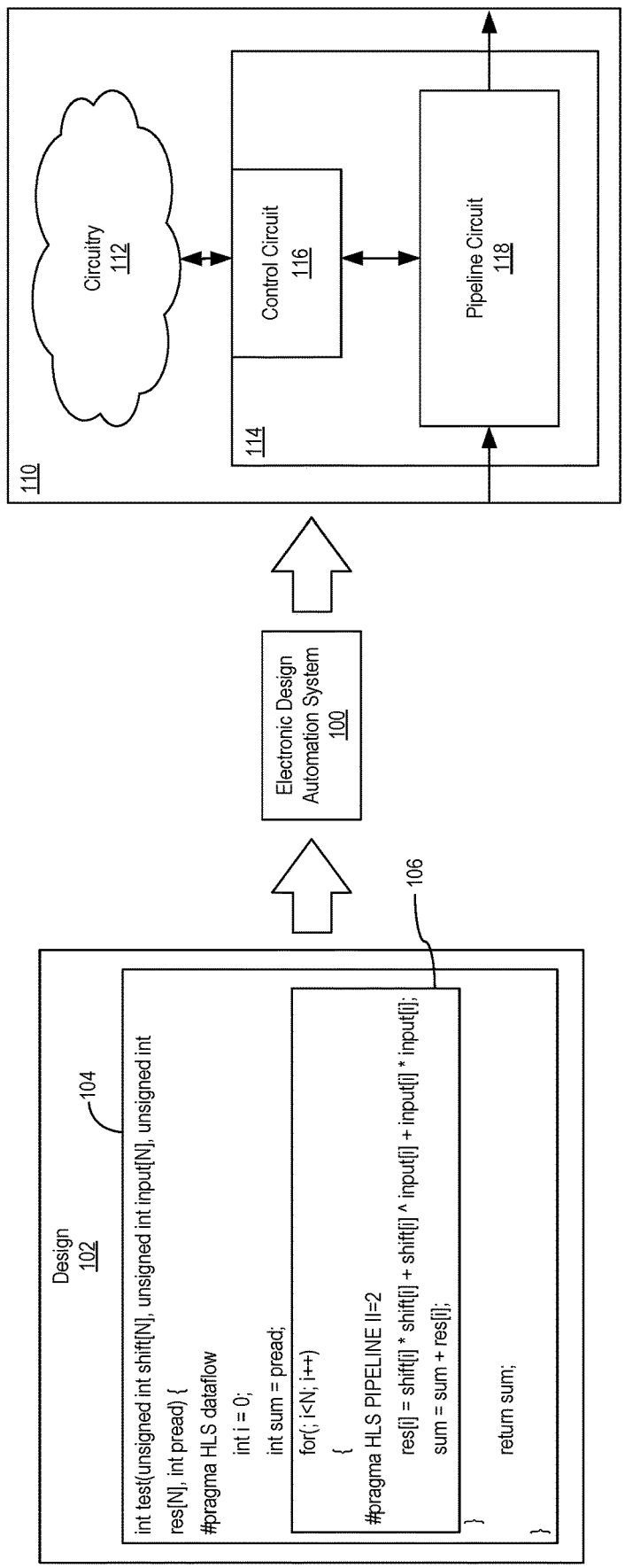
FIG. 1 illustrates certain operative features of an Electronic Design Automation (EDA) system performing High-Level Synthesis (HLS).

FIG. 1 illustrates certain operative features of an EDA system 100 performing High-Level Synthesis (HLS). EDA system 100 may be implemented as a data processing system, e.g., a computer, executing suitable program code. An example of a data processing system that may be used to implement EDA system 100 is described herein in connection with FIG. 9.

In the example of FIG. 1, EDA system 100 receives a design 102 as input. Design 102 may be specified using a high-level programming language. In this regard, design 102 may be specified as source code. As defined herein, the term "high-level programming language" means a programming language, or set of instructions, used to program a data processing system where the instructions have a strong abstraction from the details of the data processing system (e.g., machine language). For example, a high-level programming language may automate or hide aspects of operation of the data processing system such as memory management. The amount of abstraction typically defines how "high-level" the programming language is. Using a high-level programming language frees the user from dealing with registers, memory addresses, and other low-level features of the data processing system upon which the high-level programming language will execute. In this regard, a high-level programming language may include little or no instructions that translate directly, on a one-to-one basis, into a native opcode of a central processing unit (CPU) of a data processing system. Examples of high-level programming languages include, but are not limited to, C, C++, SystemC, OpenCL C, or the like.

Design 102 may include a function 104. In this example, function 104 is a "test" function. Function 104 may include a loop construct 106. As defined herein, the term "loop construct" means a plurality of instructions implemented in program code that cause a data processing system to execute one or more of the instructions until a condition occurs. A loop construct typically includes a header and a body. The header is one or more statements that define a condition. The body is one or more instructions that execute until the condition specified by the header occurs. Examples of loop constructs include, but are not limited to, a "for" loop construct, an "if-then" construct, an "if-then-else" construct, and so forth. In the example of FIG. 1, loop construct 106 is a "for" loop construct.

EDA system 100 is capable of translating design 102 into a circuit design 110. Circuit design 110 may be specified in a hardware description language. As defined herein, the term "hardware description language" or "HDL" is a computer-language that facilitates the documentation, design, and manufacturing of a digital system, such as an integrated circuit. An HDL may be expressed in human readable form and combines program verification techniques with expert system design methodologies. Using an HDL, for example, a user can design and specify an electronic circuit, describe the operation of the circuit, and create tests to verify operation of the circuit. An HDL includes standard, text-based expressions of the spatial and temporal structure and behavior of the electronic system being modeled. HDL syntax and semantics include explicit notations for expressing concurrency. In contrast to most high-level programming languages, an HDL also includes an explicit notion of time, e.g., clocks and/or clock signals, which is a primary attribute of a digital system. For example, a circuit design specified in an HDL may describe the behavior of a circuit as data transfers occur between registers of the circuit each clock cycle. Examples of HDLs may include, but are not limited to, Verilog and VHDL. HDLs are sometimes referred to as register transfer level (RTL) descriptions of circuit designs and/or digital systems. Both Verilog and VHDL support the ability to specify attributes on modules in their native syntax.

Circuit design 110 defines a hardware implementation of design 102. Design 102 includes a pipeline hardware architecture 114 corresponding to loop construct 106 and various circuits and/or systems labeled "circuitry" 112 that are external to pipeline hardware architecture 114. Circuitry 112 is coupled to pipeline hardware architecture 114. Pipeline hardware architecture 114 includes a control circuit 116 and a pipeline circuit 118. Pipeline circuit 118, in general, implements the operations from the body of the loop construct as may be modified in accordance with the inventive arrangements described herein. Control circuit 110 is capable of determining whether to execute pipeline circuit 118 again for some exit value. For example, control circuit 116 is capable of controlling whether pipeline circuit 118 performs another loop iteration of a loop execution or exits from the loop execution upon completion of a particular number of loop iterations that conforms to the condition for the loop.

Figure 2:
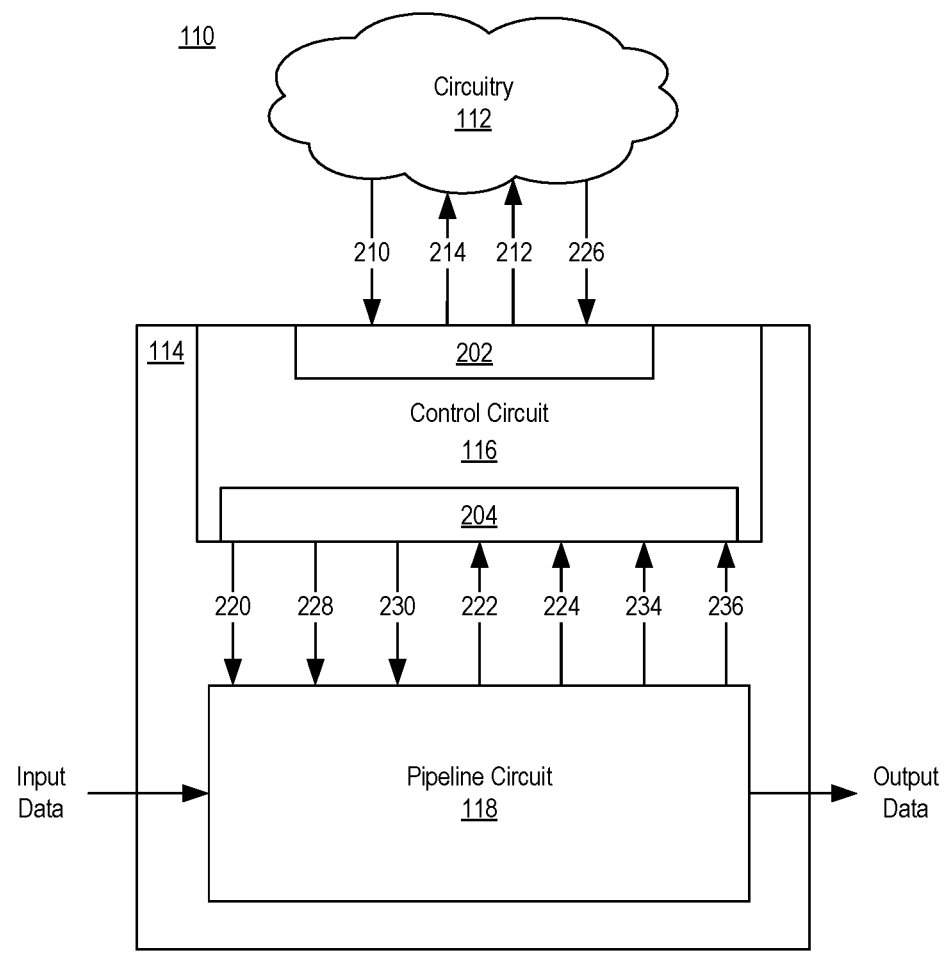
FIG. 2 is a more detailed example of the circuit design of FIG. 1 generated by the EDA system of FIG. 1.

FIG. 2 is a more detailed example of circuit design 110 of FIG. 1 as generated by EDA system 100. In the example of FIG. 2, interfaces and signaling implemented by control circuit 116 to communicate with circuitry 112 and pipeline circuit 118 are shown. Circuitry 112 interacts with pipeline circuit 118, in terms of control, via control circuit 116 to initiate loop execution of pipeline circuit 118.

The term "loop execution" means that pipeline circuit 118 performs N different sequential executions or loop iterations, where N is the boundary value or loop condition of the loop construct corresponding to pipeline circuit 118 that defines the number of sequential executions or loop iterations of the loop body to be performed. The term "loop iteration" means one execution of the loop body or pipeline circuit 118. The term "loop iteration" is used synonymously with the term "sequential execution."

Control circuit 116 communicates with circuitry 112 via interface 202. Interface 202 implements a block-level communication protocol with circuitry located outside of pipeline hardware architecture 114. Control circuit 116 communicates with pipeline circuit 118 via interface 204. Below is a list of signals exchanged between circuitry 112 and interface 202 (block level handshake with outside loop) and between pipeline circuit 118 and interface 204 (block level handshake with loop body).

The block level handshake signals with the outside loop may include the following.

Signal 210 (ap_start) is received by interface 202 from circuitry 112 to notify control circuit 116 of the start of the whole loop function, where the term "whole loop function" means "loop execution" as described herein (e.g., N loop iterations).

Signal 214 (ap_ready) is output from interface 202 to notify circuitry 112 that the whole loop function is ready to accept a new ap_start signal (210) and, as such, a new input to the whole loop function. In the example, signal 210 (ap_start) and signal 214 (ap_ready) are handshake signals.

Signal 212 (ap_done) is output from interface 202 to notify circuitry 112 that the whole loop function is done for the current loop execution.

Signal 226 (ap_continue) is received by interface 202 from circuitry 112 to notify control circuit 116 that the whole loop function can continue to execute when done. In the example, signal 212 (ap_done) and signal 226 (ap_continue) are handshake signals.

The block level handshake signals with the loop body may include the following.

Signal 220 (ap_start_int) is output from interface 204 to pipeline circuit 118 to start an execution of a loop iteration.

Signal 224 (ap_ready_int) is received by interface 204 from pipeline circuit 118 to notify control circuit 116 that the loop execution is ready to accept a new ap_start_int (signal 220) and, as such, a new input to pipeline circuit 118.

Signal 222 (ap_done_int) is received by interface 204 from pipeline circuit 118 to notify control circuit 116 when execution of a loop iteration is done.

Signal 228 (ap_continue_int) is output from interface 204 to pipeline circuit 118 to notify pipeline circuit 118 that pipeline circuit 118 may continue to execute when done.

Signal 234 (ap_loop_exit_ready) is received by interface 204 from pipeline circuit 118 to indicate that the whole loop is ready to accept a new input (e.g., begin a new loop execution) for a next call of the loop. Assertion of signal 234 may initiate assertion of signal 214 (ap_ready) to circuitry 112.

Signal 236 (ap_loop_exit_done) is received by interface 204 from pipeline circuit 118 to notify control circuit 116 when the last iteration of a loop execution of pipeline circuit 118 is done.

The following initialization signals may also be included.

Signal 230 (ap_loop_int) is output from interface 204 to pipeline circuit 118 to notify or indicate to pipeline circuit 118 of a first iteration of the loop execution (e.g., the first loop iteration performed by pipeline circuit 118 for a given function call).

Control circuit 116 may begin operation by receiving a valid signal 210 (ap_start). In response, control circuit 116 starts pipeline circuit 118 for a first loop iteration of a new or first loop execution. In addition to loop body computation circuitry or logic, pipeline circuit 118 includes circuitry that is capable of computing the loop exit condition (e.g., if i>boundary) for the loop construct. When pipeline circuit 118 determines that the loop exit condition is true, pipeline circuit 118 effectively knows that the current iteration is the last for the loop execution.

Accordingly, in response to pipeline circuit 118 finishing reading the inputs, pipeline circuit asserts signal 234 (ap_loop_exit_ready). Control circuit 116, in response to assertion of signal 234, asserts signal 214 (ap_ready). In response to pipeline circuit 118 finishing all operations for the last iteration of a given loop execution, pipeline circuit 118 asserts signal 236 (ap_loop_exit_done). In response to assertion of signal 236, control circuit 116 asserts signal 212 (ap_done).

In further illustration, control circuit 116 asserts signal 214 (ap_ready) in response to signal 224 (ap_ready_int) being asserted by pipeline circuit 118. Assertion of signal 214 (ap_ready) indicates to circuitry 112 that new data for a new loop execution may be provided into pipeline circuit 118 as input data. More particularly, new data for a new loop execution may be provided to a first state of pipeline circuit 118.

Signal 210 (ap_start) may be asserted by circuitry 112 to control circuit 116 to indicate that another loop execution of pipeline circuit 118 is desired. In the example of FIG. 2, signal 210 (ap_start) may be asserted by circuitry 112 only while signal 214 (ap_ready) is asserted. Signal 214 (ap_ready) is asserted in response to assertion of signal 224 (ap_ready_int). For example, signal 210 (ap_start) may be asserted. Signal 210 (ap_start) may remain asserted until signal 214 (ap_ready) is asserted. In response to signal 214 (ap_ready) being asserted, signal 210 (ap_start) may remain asserted if another loop execution is desired or pulled down if no further loop execution is desired. In response to signal 210 (ap_start) being asserted, signal 220 (ap_start_int) to pipeline circuit 118 is asserted.

Signal 212 (ap_done) is asserted in response to signal 236 (ap_loop_exit_done) is asserted. Signal 212 (ap_done) indicates to circuitry 112 that a loop execution of pipeline circuit 118, including the last loop iteration of the loop execution, is complete and that the data for the loop execution has been fully processed through the pipeline.

In general, signal 224 (ap_ready_int) is asserted in response to the first state of pipeline circuit 118 completing execution of the last loop iteration of a loop execution. In some cases, signal 224 (ap_ready_int) is asserted in response to the last state of the first instruction interval completing execution for the last loop iteration of a loop execution. Other scenarios may exist in which input is read after the last state of the first instruction interval where the instruction interval is only related to dependence. Signal 224 (ap_ready_int) indicates that, for a pipeline circuit with an instruction interval of 1, for example, a new input for a next loop execution may be received in the first state of pipeline circuit 118. For purposes of illustration an instruction interval of 1 is presumed. In another example, where the instruction interval is 2, for example, signal 224 (ap_ready_int) is asserted in response to the second state of pipeline circuit 118 completing execution.

Signal 236 (ap_loop_exit_done) is asserted in response to the exit state of pipeline circuit 118 completing execution for the last loop iteration of a loop execution. The exit state of pipeline circuit 118 may or may not be the last state of pipeline circuitry 118. For example, all operations before the last iteration should be done after the exit state is executed. For the last iteration, all operations after the exit state can be ignored. That is, the portion of the loop body can be ignored once the loop variable "i" is larger than the boundary.

Signal 220 (ap_start_int) is asserted to pipeline circuit 118 to indicate the start of a new loop execution. Assertion of signal 220 (ap_start_int) also indicates that pipeline circuit 118 is starting a first loop iteration of a new loop execution. As will be described hereinbelow in greater detail, signal 220 (ap_start_int) indicates that certain operations relocated from outside of pipeline circuit 118 to within pipeline circuit 118 are to be performed. Pipeline circuit 118 is capable of determining, in response to the exit condition being met, that the last or exit state of pipeline circuit 118 of the last iteration of a loop execution should perform the operations moved therein as described in greater detail below.

For purposes of example and further illustration, pipeline circuit 118 itself tracks the loop exit condition. Based on the loop exit condition and the entering of certain state(s) in the pipeline region, pipeline circuit 118 sends certain signals (e.g., signal 234 (ap_loop_exit_ready) and signal 236 (ap_loop_exit_done)) as described above to notify control circuit 116 when the last loop iteration is done reading input or is fully done. Control circuit 116, in response to notification from pipeline circuit 118 as described, is capable of sending signal 214 (ap_ready) to external circuitry 112. Circuitry 112 represents circuitry external to the function. Based on receiving signal 210 (ap_start), the control circuit 116 determines whether to start the next loop execution. In response to receiving signal 236 (ap_loop_exit_done) control circuit 116 sends or asserts signal 212 (ap_done) to circuitry 112 indicating completion of one loop execution.

Figure 3:
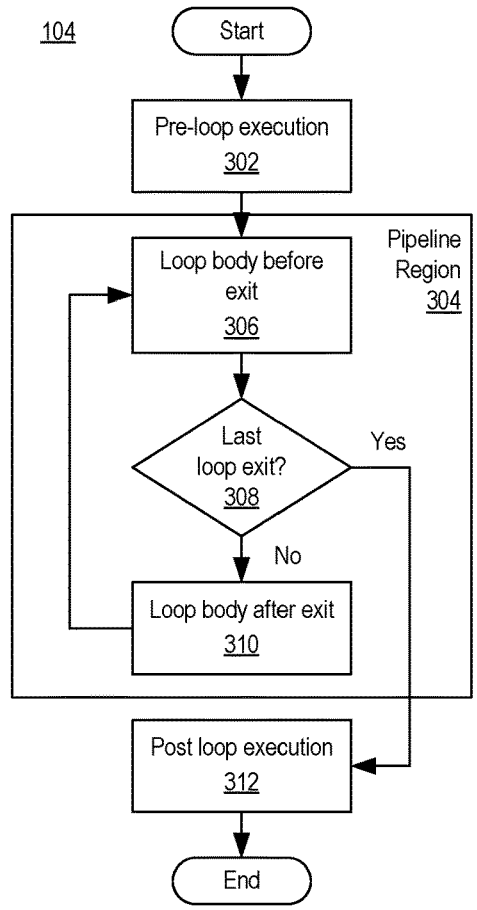
FIG. 3 is an example representation of the function from the design of FIG. 1.

FIG. 3 is an example representation of function 104 from design 102 of FIG. 1. In the example, pre-loop execution block 302 represents portions of function 104 that execute outside of the loop construct. Referring to design 102, the statements such as "int i=0;" and "int sum=pread;" are considered pre-loop execution block 302. Pipeline region 304 represents loop construct 106. Instructions within the loop construct 106 such as "res[i]=shift[i]*shift[i]+shift[i] A input[i]+input[i]*input[i];" and "sum=sum+res[i];" are considered loop body after exit 310. In the case of a typical "for-loop" construct, loop body before exit 306 represents the comparison that is performed to determine whether the loop should exit. Post loop execution block 312 includes instructions that execute after the loop exits and, as such are outside of loop construct 106. Design 102 does not include any instructions as examples of post loop execution block 312.

In one aspect, EDA system 100 may include a compiler that is capable of processing design 102 through a front-end compilation process. That front-end compilation process, as performed by EDA system 100, may include first translating design 102 into an intermediate format. With design 102 having been transformed into an intermediate format used by the compiler, EDA system 100 is capable of analyzing function 104 to classify the instructions thereof into a framework such as that illustrated in FIG. 3.

As defined within this disclosure, the term "intermediate representation" is the code, specified as a data structure, used internally by a compiler to represent source code. A compiler translates high-level programming language source code into intermediate representation to perform further operations on the source code. An intermediate representation is designed to be conducive to further processing, such as optimization of source code and further translation of the source code into an executable or a hardware implementation. An intermediate representation is an accurate representation of the source code that is capable of representing the source code without loss of information and is independent of any particular source or target language. In some cases, the intermediate representation may use a static single assignment (SSA) compliant form. Examples of intermediate representations include, but are not limited to, stack machine code, two address code, three address code, and/or a graph data structure. Other examples of intermediate representations may include, but are not limited to Low Level Virtual Machine (LLVM) intermediate representation and GNU Compiler Collection (GCC) intermediate representation.

Figure 4:
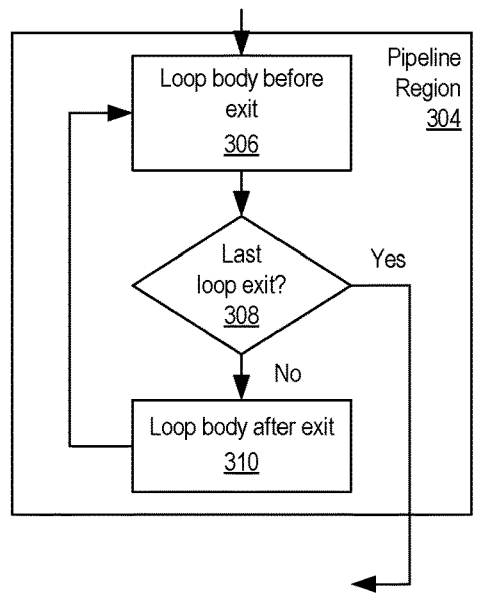
FIG. 4 illustrates an example of loop extraction as performed by the EDA system of FIG. 1.

FIG. 4 illustrates an example of loop extraction as performed by EDA system 100. EDA system 100 is capable of analyzing design 102 to detect function 104 having loop construct 106 included therein. The example of FIG. 4 illustrates that EDA system 100 is capable of extracting loop construct 106 from function 104. In one or more example implementations, EDA system 100 is capable of creating a new and empty function that is part of design 102 and including extracted loop construct 106 into the newly created function. FIG. 4 illustrates that EDA system 100 has extracted pipeline region 304 from function 104.

Figure 5:
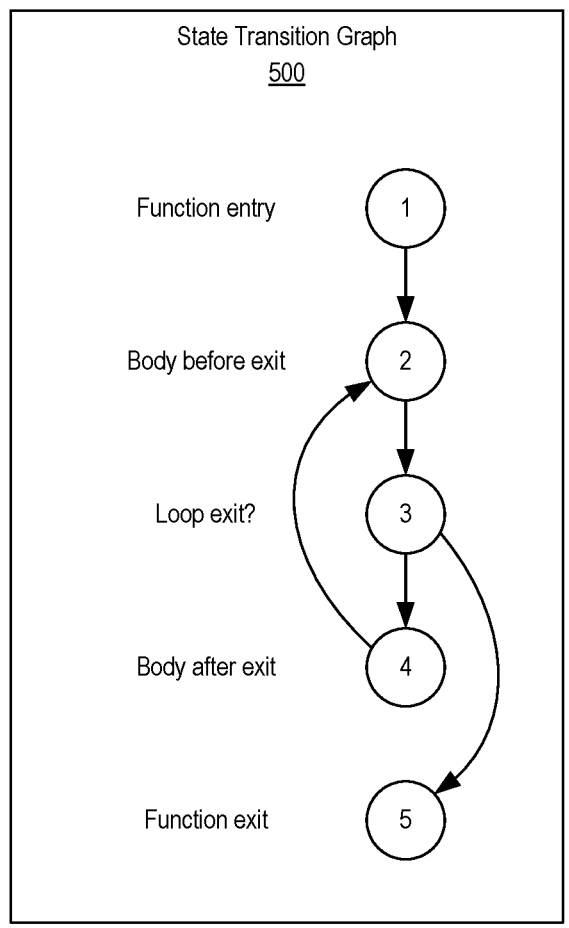
FIG. 5 illustrates an example of a state transition graph (STG) created by the EDA system of FIG. 1.

FIG. 5 illustrates an example of a state transition graph (STG) 500 created by EDA system 100. EDA system 100 is capable of creating STG 500, specified as a data structure, from pipeline region 304. STG 500 represents a loop construct of a function (e.g., loop construct 106 of function 104) of a design. In the example of FIG. 5, STG 500 includes states 1, 2, 3, 4, and 5. State 1 is a function entry state. The function entry state is located outside of the pipeline region and is the first state of the function. State 2 represents the body before exit state. State 3 represents the loop exit state. State 4 represents the body after exit state. State 5 represents the function exit state. The function exit state is outside of the pipeline region and is the last state of the function. The number of states illustrated in FIG. 5 is for purposes of example only and is not intended as a limitation as to the number of states included in pipeline region 304.

Figure 6:
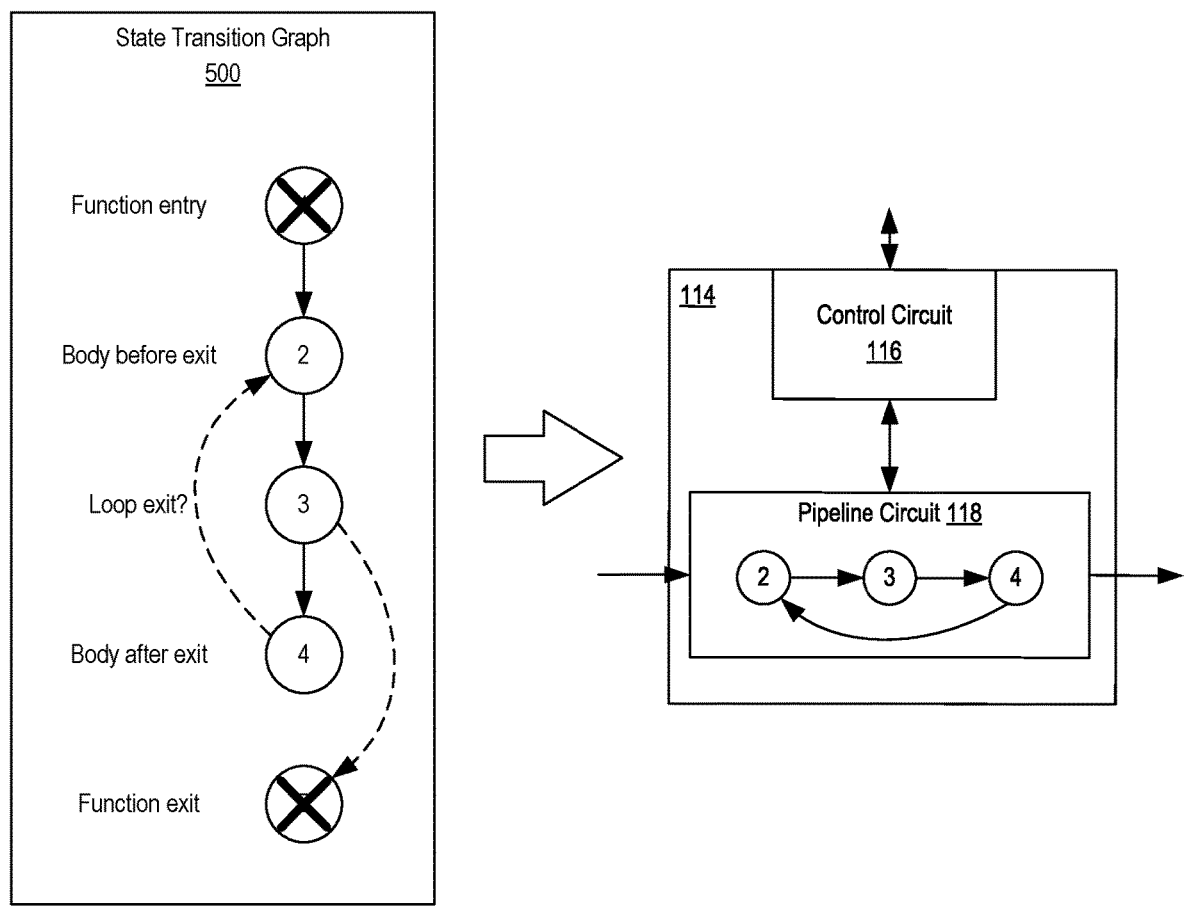
FIG. 6 illustrates an example of STG pruning and circuit design generation as performed by the EDA system of FIG. 1.

FIG. 6 illustrates an example of STG pruning and circuit design generation (e.g., HDL generation) as performed by EDA system 100. In the example of FIG. 6, EDA system 100 identifies the finite state machine (FSM) operations contained in state 1 (e.g., the function entry state) and in state 5 (the function exit state).

In one example implementation, EDA system 100 is capable of removing the operations from state 1 (function entry state) of STG 500 and pushing, or relocating, the operations from state 1 into the first state of the pipeline region, which is the second or next state, e.g., state 2, of STG 500. Having removed the operations from state 1 leaving state 1 empty, EDA system 100 deletes or removes state 1 from STG 500. EDA system 100 further is capable of removing the edge connecting state 1 and state 2 from STG 500.

In another example implementation, EDA system 100 is capable of prepending the function entry state before the first state of the pipeline region. Prepending adds an additional state to the pipeline region. That is, in the example of FIG. 6, state 1 is prepended before state 2 within pipeline circuit 118 (e.g., placed in the pipeline region). Prepending may be used as a pruning technique with respect to the function entry state to reduce the amount of circuit (e.g., IC) resources needed for implementation. In some cases, performing the pruning by pushing operations results in the hardware implementation using an increased number of multiplexers to account for init scalar alloca/phi operations and use of the value of the init in the same state. Accordingly, in one aspect, EDA system 100 is capable of performing pruning using the pushing technique and determining the number of multiplexers needed for the hardware implementation of hardware pipeline architecture 114. In response to determining that the number of multiplexers exceeds a threshold number of multiplexers or that the amount of hardware resources increases by more than a threshold amount, EDA system 100 may perform the pruning, with respect to the function entry state, using the prepending technique instead of the pushing technique to reduce the amount of circuit resources (e.g., multiplexers in this example) that are needed. In general, pruning using prepending may be performed as an alternative since prepending adds an additional state to pipeline circuit 118, thereby increasing latency of pipeline circuit 118.

The pruning may continue where EDA system 100 is capable of removing the operations from state 5 of STG 500 and pushing, or relocating, the operations from state 5 (the function exit state) into the exit state of the pipeline region, which is the second to last state 4 of STG 500. Having removed the operations from state 5 leaving state 5 empty, EDA system 100 is capable of deleting or removing state 5 from STG 500. EDA system 100 further is capable of removing the edge connecting state 4 and state 5 from STG 500.

In the example of FIG. 6, the branches connecting states 4-2 and states 3-5 of STG 500 are shown as dashed lines. The dashed lines illustrate that EDA system 100 removes the state transitions (e.g., the state transitions from outside of the pipeline to the pipeline and from the pipeline to outside of the pipeline) that are based on the computation result of the exit condition from STG 500. These state transitions may be referred to as loop exit and loop iteration state transitions.

In one aspect, as part of the pruning process, EDA system 100 removes the noted state transitions from STG 500. The removed state transitions may be included in another module of design 102 that serves as the basis for control circuit 116. In this regard, blocks 114, 116, and 118, in the example of FIGS. 1, 2, and 6, represent portions of HDL generated by EDA system 100 based on design 102 and, more particularly, pruned STG 500. The example of FIG. 6 shows that EDA system 100 removes particular state transitions included in STG 500 so that such state transitions are included in control circuit 116, as opposed to pipeline circuit 118, to control operation of pipeline circuit 118. In consequence of the STG pruning, STG 500 includes the remaining states 2, 3, and 4, where state 2 includes the operations from state 1 and state 4 includes the operations from state 5. EDA system 100 translates the pruned STG to generate circuit design 110 as illustrated in FIGS. 1 and 6.

For purposes of illustration, the prepending technique for pruning is not shown. In an example where prepending is used, pipeline circuit 118 may include states 1, 2, 3, and 4, however.

The example pruning operations allow control circuit 116 to be implemented in a generalized manner. Further, the pruning operations allow pipeline circuit 118 to be implemented to always execute a sequential flow. That is, there is no jumping to another state or jumping out of a state that violates the sequential flow of pipeline circuit 118. Further, the pruning keeps the number of states in the pipeline region set to a known, fixed number for purposes of HLS.

The STG pruning operation performed by EDA system 100 is further illustrated with reference to Examples 1-4 hereinbelow. Example 1 illustrates an example STG generated by EDA system 100 for a loop construct extracted from another function of a design as previously described. In Example 1, the STG includes a pipeline from state 2 to state 11. The pipeline has an instruction interval of 2. As noted above, the first state of the STG is referred to as the function entry state. The last state of the STG is referred to as the function exit state. For purposes of illustration, the states of the STG in Examples 1-4 prior to STG pruning are referred to as "original" states. States post STG pruning are renumbered and are referred to as "modified" states.

Example 1

Number of FSM states: 12
Pipeline: 1
Pipeline-0: II=2, D=10, States={2 3 4 5 6 7 8 9 10 11}
Dataflow Pipeline: 0
FSM state transitions:
1→2
2→12 3
3→4
4→5
5→6
6→7
7→8
8→9
9→10
10→11
11→2
12→

Example 2 illustrates the finite state machine (FSM) operations performed in original states 1, 2, 11, and 12. The other states are omitted for ease of illustration. Original state 1 (e.g., the function entry state) includes operations 13, 14, 15, 16, and 17. Original state 2 includes operations 18, 19, and 20. Original state 11 includes operations 45, 46, 47, and 48. Original state 12 (e.g., the function exit state) includes operation 49.

Example 2

State 1<SV=0><Delay=0.85>
   ST_1: Operation 13 [1/1] (0.00 ns)→"%specinterface_In0=specinterface void @_ssd-m_op_SpecInterface, i32 %res, void @empty, i32, i32, void @empty_0, i32, i32, void @empty_0, void @empty_0, void @empty_0, i32, i32, i32, i32, void @empty_0, void @empty_0"→Operation 13 'specinterface'
   'specinterface_In0'<Predicate=true><Delay=0.00>
   ST_1: Operation 14 [1/1] (0.00 ns)→"%specinterface_In0=specinterface void @_ssdm_op_SpecInterface, i32 %input_r, void @empty, i32, i32, void @empty_0, i32, i32, void @empty_0, void @empty_0, void @empty_0, i32, i32, i32, i32, void @empty_0, void @empty_0"→Operation 14 'specinterface' 'specinterface_In0'<Predicate=true><Delay=0.00>

ST_1: Operation 15 [1/1] (0.00 ns)→"%specinterface_In0=specinterface void @_ssdm_op_SpecInterface, i32 %shift, void @empty, i32, i32, void @empty_0, i32, i32, void @empty_0, void @empty_0, void @empty_0, i32, i32, i32, i32, void @empty_0, void @empty_0"→Operation 15 'specinterface' 'specinterface_In0'<Predicate=true><Delay=0.00>

ST_1: Operation 16 [1/1] (0.00 ns)→"%pread_read=read i32 @_ssdm_op_Read.ap_auto.i32, i32 %pread"→Operation 16 'read' 'pread_read'<Predicate=true><Delay=0.00>

ST_1: Operation 17 [1/1] (0.85 ns)→"%br_In0=br void %for.cond.i.i"→Operation 17 'br' 'br_In0'<Predicate=true><Delay=0.85>

State 2<SV=1><Delay=1.14>

ST_2: Operation 18 [1/1] (0.00 ns)→"%i=phi i4 %add_In7, void %for.inc.i.i, i4, void %newFuncRoot" [for1.cpp:7]→Operation 18 'phi' 'i'<Predicate=true><Delay=0.00>

ST_2: Operation 19 [1/1] (0.00 ns)→"%sum=phi i32 %sum_1, void %for.inc.i.i, i32 %pread_read, void %newFuncRoot"→Operation 19 'phi' 'sum'<Predicate=true><Delay=0.00>

ST_2: Operation 20 [1/1] (0.00 ns)→"%specpipeline_In6=specpipeline void @_ssdm_op_SpecPipeline, i32, i32, i32, i32, void @empty_2" [for1.cpp:6]→Operation 20 'specpipeline' 'specpipeline_In6'<Predicate=true><Delay=0.00>

. . .

State 11<SV=10><Delay=1.51>

ST_11: Operation 45 [1/1] (0.00 ns)→"%res_addr=getelementptr i32 %res, i64, i64 %zext_In10" [for1.cpp:10]→Operation 45 'getelementptr' 'res_addr' <Predicate=(!icmp_In7)><Delay=0.00>

ST_11: Operation 46 [1/1] (1.14 ns)→"%store_In10=store i32 %xor_In10, i4% res_addr" [for1.cpp:10]→Operation 46 'store' 'store_In10'<Predicate=(!icmp_In7)><Delay=1.14><Core="RAM">→Core 23 'RAM'<Latency=1><II=1><Delay=1.14><Storage><Opcode:'load' 'store'><Ports=2><Width=32><Depth=11><RAM>

ST_11: Operation 47 [1/1] (1.51 ns)→"%sum_1=add i32 %xor_In10, i32 %sum" [for1.cpp:11]→Operation 47 'add' 'sum_1'<Predicate=(!icmp_In7)><Delay=1.51><Core="Adder">→Core 2 'Adder'<Latency=0><II=1><Delay=1.51><Func Unit><Opcode: 'add' 'sub'><InPorts=2><OutPorts=1>

ST_11: Operation 48 [1/1] (0.00 ns)→"%br_In7=br void %for.cond.i.i" [for1.cpp:7]→Operation 48 'br' 'br_In7'<Predicate=(!icmp_In7)><Delay=0.00>

State 12<SV=2><Delay=0.00>

ST_12: Operation 49 [1/1] (0.00 ns)→"%ret_In11=ret i32 %sum" [for1.cpp:11]→Operation 49 'ret' 'ret_In11'<Predicate=true><Delay=0.00>

Both Examples 1 and 2 illustrate the state of the STG prior to performance of STG pruning performed by EDA system 100. In general, in performing STG pruning, EDA system 100 takes operations from the original state 1 (e.g., the first state of the function) shown in Examples 1 and 2 and moves the operations into original state 2 (e.g., the first state of the pipeline region). In this example, the operations are moved by using the push technique. In another example, the operations may be moved using the prepending technique. Subsequent to the movement of the operations, original state 1 is deleted from the STG. In addition, in performing STG pruning, EDA system 100 takes operations from the original state 12 (e.g., the last state of the function) shown in Examples 1 and 2 and pushes the operations into original state 11 (e.g., the last state of the pipeline region). Subsequent to the push, original state 12 is deleted from the STG. The remaining states are renumbered so that original state 2 is renumbered state 1, etc.

Example 3 illustrates the STG of Examples 1 and 2 subsequent to EDA system 100 performing the STG pruning. In Example 3, original state 1 (e.g., the function entry state) is merged with original state 2; and original state 12 is merged with original state 11. Original states 1 and 12 are deleted. The remaining states are renumbered as modified states 1-10.

Example 3

Number of FSM states: 10
Pipeline: 1
Pipeline-0: II=2, D=10, States={1 2 3 4 5 6 7 8 9 10}
Dataflow Pipeline: 0
FSM state transitions:
1→2
2→3
3→4
4→5
5→6
6→7
7→8
8→9
9→10

Example 4 illustrates the operations of the FSM of the STG of Example 3 post STG pruning as performed by EDA system 100. In Example 4, EDA system 100 has pushed operations 13, 14, 15, 16, and 17 of original state 1 into original state 2. EDA system 100 further has pushed operation 49 of original state 12 into original state 11. With original states 1 and 12 being empty, EDA system 100 has deleted original states 1 and 12 and renumbered the remaining states 1-10 (as modified). Accordingly, modified state 1 includes the operations of original states 1 and 2. Modified state 10 includes the operations of original states 11 and 12.

Example 4

State 1<SV=1><Delay=1.14>

ST_1: Operation 13 [1/1] (0.00 ns)→"%specinterface_In0=specinterface void @_ssdm_op_ SpecInterface, i32 %res, void @empty, i32, i32, void @empty_0, i32, i32, void @empty_0, void @empty_0, void @empty_0, i32, i32, i32, i32, void @empty_0, void @empty_0"→Operation 13 'specinterface' 'specinterface_In0'<Predicate=true><Delay=0.00>

ST_1: Operation 14 [1/1] (0.00 ns)→"%specinterface_In0=specinterface void @_ssdm_op_SpecInterface, i32 %input_r, void @empty, i32, i32, void @empty_0, i32, i32, void @empty_0, void @empty_0, void @empty_0, i32, i32, i32, i32, void @empty_0, void @empty_0"→Operation 14 'specinterface'
'specinterface_In0'<Predicate=true><Delay=0.00>
ST_1: Operation 15 [1/1] (0.00 ns)→"%specinterface_In0=specinterface void @_ssdm_op_SpecInterface, i32 %shift, void @empty, i32, i32, void @empty_0, i32, i32, void @empty_0, void @empty_0, void @empty_0, i32, i32, i32, i32, void @empty_0, void @empty_0"→Operation 15 'specinterface'
'specinterface_In0'<Predicate=true><Delay=0.00>
ST_1: Operation 16 [1/1] (0.00 ns)→"%pread_read=read i32 @_ssdm_op_Read.ap_auto.i32, i32 %pread"→Operation 16 'read'
'pread_read'<Predicate=true><Delay=0.00>ST_1: Operation 17 [1/1] (0.85 ns)→"%br_In0=br void %for.cond.i.i"→Operation 17 'br' 'br_In0'
<Predicate=true><Delay=0.85>
ST_1: Operation 18 [1/1] (0.00 ns)→"%i=phi i4%add_In7, void %for.inc.i.i, i4, void %newFuncRoot" [for1.cpp:7]→Operation 18 'phi' 'i'<Predicate=true><Delay=0.00>
ST_1: Operation 19 [1/1] (0.00 ns)→"%sum=phi i32 %sum_1, void %for.inc.i.i, i32 %pread_read, void %newFuncRoot"→Operation 19 'phi' 'sum'<Predicate=true><Delay=0.00>
ST_1: Operation 20 [1/1] (0.00 ns)→"%specpipeline_In6=specpipeline void @_ssdm_op_SpecPipeline, i32, i32, i32, i32, void @empty_2" [for1.cpp:6]→Operation 20 'specpipeline'
'specpipeline_In6'<Predicate=true><Delay=0.00>
State 10<SV=10><Delay=1.51>
ST_10: Operation 45 [1/1] (0.00 ns)→"%res_addr=getelementptr i32 %res, i64, i64 %zext_In10" [for1.cpp:10]→Operation 45 'getelementptr' 'res_addr'<Predicate=(!icmp_In7)><Delay=0.00>
ST_10: Operation 46 [1/1] (1.14 ns)→"%store_In10=store i32 %xor_In10, i4% res_addr" [for1.cpp:10]→Operation 46 'store' 'store_In10'<Predicate=(!icmp_In7)
><Delay=1.14><Core="RAM">→Core 23 'RAM'<Latency=1><II=1><Delay=1.14><Storage><Opcode: 'load'
'store'<Ports=2><Width=32><Depth=11><RAM>
ST_10: Operation 47 [1/1] (1.51 ns)→"%sum_1=add i32 %xor_In10, i32 %sum" [for1.cpp:11]→Operation 47 'add' 'sum_1'<Predicate=(!icmp_In7)
><Delay=1.51><Core="Adder">→Core 2 'Adder'<Latency=0><II=1><Delay=1.51><Func Unit><Opcode:'add' 'sub'<InPorts=2><OutPorts=1>
ST_10: Operation 48 [1/1] (0.00 ns)→"%br_In7=br void %for.cond.i.i" [for1.cpp:7]→Operation 48 'br' 'br_In7'<Predicate=(!icmp_In7)><Delay=0.00>
ST_10: Operation 49 [1/1] (0.00 ns)→"%ret_In11=ret i32 %sum" [for1.cpp:11]→Operation 49 'ret' 'ret_In11'<Predicate=true><Delay=0.00>

Examples 1-4 illustrate that EDA system 100, in performing STG pruning, moves all operations of the function entry state (e.g., original state 1) into original state 2, which is the first state of the pipeline region implemented in the pipeline circuit. Similarly, EDA system pushes all operations of the function exit state (e.g., original state 12) into original state 11, which is the last state of the pipeline region implemented in the pipeline circuit.

In the examples described, the last state of the pipeline region may also be the pipeline exit state. The pipeline exit state, however, need not be the last state of the pipeline region. In one or more other example implementations, the operations of the function exit state may be pushed into a pipeline exit state of the pipeline region that is not the last state of the pipeline region. An example where the operations of the function exit state are pushed into the pipeline exit state of the pipeline region that is not the last state of the pipeline region is described in connection with FIG. 7.

As part of STG pruning, EDA system 100 may perform additional operations not reflected in Examples 1-4. Subsequent to pushing the operations from original state 1 into original state 2 and deleting original state 1, the EDA system is capable of adding "loop_init==1" as the condition on the dataflow from the branch node corresponding to operation 17 to the two PHI nodes corresponding to operations 18 and 19 so that the correct PHI logic may be generated. Further, subsequent to pushing all operations from original state 12 to original state 11 and deleting original state 11, the return occurs in modified state 10 (e.g., as renumbered subsequent to the deletion of original states 1 and 12).

The PHI nodes are used to determine the value of "i" when a different branch comes into a basic block. A basic block represents a single-entry, single-exit section of code. Basic blocks contain a list of instructions that form the body of the block. When jumping into operation 18 from the end of the loop, the value of "add_In7" is the previous value of "i" incremented by 1. When jumping into the basic block from a new function root, which is the entry basic block to the basic block, the value of 0 is used.

Moving operations into the loop body as described in connection with Examples 1-4 causes EDA system 100 to introduce a signal 220 (ap_start_int) to indicate and distinguish the first loop iteration of a loop execution from the other loop iterations of the loop execution. With the function entry state removed, all the operations in the function entry state are moved into the pipeline region. The operations of the function entry state within the pipeline region are to execute only once for the whole loop execution (e.g., in the first loop iteration), while the pipeline region corresponding to the loop body, is executed N times. Signal 220 (ap_start_int) functions as a guard so that the operations moved from the function entry state into the pipeline region will only execute once and only for the first loop iteration. As discussed, signal 220 indicates to pipeline circuit 118 when a loop iteration is the first loop iteration of a loop execution and, as such, that the operations moved into the pipeline region from the function entry state are to be performed.

Pipeline circuit 118 is capable of tracking the number of iterations and determining the last iteration of a loop execution. In performing the last iteration of a loop execution, pipeline circuit 118 performs the operations moved into the pipeline region from the function exit state. As such, the operations of the function exit state, as moved within the pipeline region, are to execute only once for the whole loop execution (e.g., in the last loop iteration), while the pipeline region corresponding to the loop body, is executed N times. In performing the loop execution and tracking the iterations, pipeline circuit 118 is capable of generating the various signals described herein in connection with FIG. 2 at the appropriate times.

Example 5 illustrates example pseudo code implemented by EDA system 100 in pruning the STG.

Example 5

1. Move (e.g., via push or prepend) all operations in the function entry state to the first state of the loop pipeline (e.g., the second original state following the function entry state):

a. For each operation in the function entry state:
  i. For each PHI node using the output of an operation pushed into the first state of the loop pipeline, add "loop_init='1'" as the condition on the dataflow from the branch node in the initialization block to the PHI node.
2. Remove function entry state and the edge for jumping into the loop region.
3. Push all operations in the function exit state to the exit state of the loop pipeline:
  a. Record the exit condition. The exit condition is used to generate the exit_ready and exit_done signals and to guard the operations pushed from function exit state to the pipeline exit state.
4. Remove function exit state and the edge from loop region to exit.

FIG. 7 illustrates example operations for flushing pipeline region 304 over a plurality of loop iterations of a loop execution. For purposes of illustration the instruction interval in the example of FIG. 7 is 1. Pipeline circuit 118 includes states 2, 3, and 4 as described in connection with FIG. 6. Accordingly, new input may be accepted into the pipeline region every clock cycle to begin another loop iteration. In this example, the loop exit condition is calculated in state 3 and is determined to be true in row 3 where loop iteration 4 (LI4) enters state 3. In response to determining that the loop execution is complete in state 3, data to the left of state 3 in the pipeline circuit need not be executed. That is, the next iteration (e.g., LI5) started in state 2 is a dummy loop iteration that need not complete execution through the pipeline. The instruction interval of 1 means that the last iteration (LI3) of the loop execution will complete execution in state 4 when the loop exit condition is determined to be true in state 3 (e.g., one state earlier corresponding to the instruction interval of 1).

The example of FIG. 7 illustrates that the pipeline exit state into which the operations of the last state are pushed need not be the last state in the pipeline region or circuit as the case may be. In the example of FIG. 7, the pipeline circuit may be implemented so that state 3 generates signal 236 (ap_loop_exit_done) to notify control circuit 116 that loop execution is done. The operations of the function exit state may have been pushed into state 3 and may be executed for the last loop iteration. While the pipeline exit state may be implemented as the last state in the pipeline region, optimization may be performed to move the pipeline exit state earlier in the pipeline region if operations in certain states need not be performed once the exit condition is detected. The location of the pipeline exit state in the pipeline region may also depend on the instruction interval of the pipeline.

Figure 8:
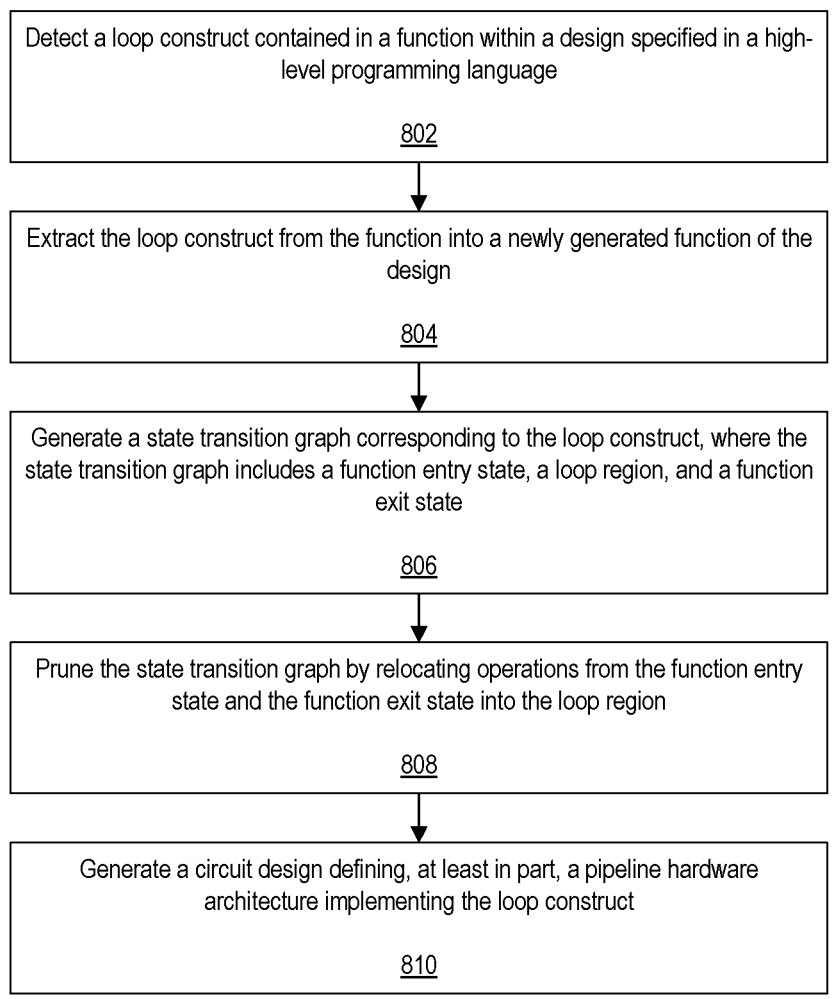
FIG. 8 is an example method illustrating certain operative features of the EDA system of FIG. 1.

FIG. 8 is a method 800 illustrating certain operative features of EDA system 100 of FIG. 1. The foregoing and other implementations can each optionally include one or more of the following features, alone or in combination. Some example implementations include all the following features in combination.

In block 802, EDA system 100 is capable of detecting a loop construct 106 contained in a function 104 within a design 102 specified in a high-level programming language. For example, design 102 may be provided to EDA system 100 for purposes of HLS. In one aspect, the detecting includes first generating an intermediate representation of the design 102.

In block 804, EDA system 100 is capable of extracting the loop construct 106 from the function 104 into a newly generated function of the design 102. In block 806, EDA system 100 is capable of generating an STG corresponding to the loop construct. An example of an STG is illustrated in FIG. 5. The STG may include a function entry state, a loop region, and a function exit state. The loop region may include a plurality of states including the state following the function entry state, the state immediately preceding the function exit state, and each state therebetween.

In block 808, EDA system 100 is capable of pruning the STG by relocating operations from the function entry state and the function exit state into the loop region. In one example, EDA system 100 is capable of relocating operations of the function entry state of the STG to a first state of the loop region and removing the function entry state from the STG. In another example, EDA system 100 is capable of prepending the function entry state prior to the first state of the loop region. In another example, EDA system 100 is capable of relocating operations of the function exit state of the STG to a pipeline exit state of the loop region and removing the function exit state from the STG. The pipeline exit state may or may not be the last state of the pipeline region.

In another aspect, the pruning can include detecting loop exit and loop iteration state transitions and separating the loop exit and the loop iteration state transitions from the loop region. For example, EDA system 100 is capable of removing branches of the STG that correspond to loop exit and loop iteration (e.g., the branches that depend on the computation result of the exit condition. The removed branches may be used to generate, at least in part, a hardware description language module corresponding to control circuit 116.

An example of the pruning performed by EDA system 100 is described in connection with FIG. 6 and Examples 1-4.

In block 810, EDA system 100 is capable of generating a circuit design 110 defining, at least in part, a pipeline hardware architecture 114 including the loop construct 106. The circuit design 110 may be generated based, at least in part, on the pruned STG. In one aspect, the pipeline hardware architecture 114 includes a control circuit 116 and a pipeline circuit 118. The control circuit 116 may implement the loop exit and loop iteration state transitions. The pipeline circuit 118 may operate under control of the control circuit 116. Pipeline circuit 118 may implement the loop region.

In another aspect, control circuit 116 is capable of implementing a first predetermined interface 202 with circuitry external to pipeline hardware architecture 114 (e.g., with circuitry 112) and a second predetermined interface 204 with the pipeline circuit 118.

Figure 9:
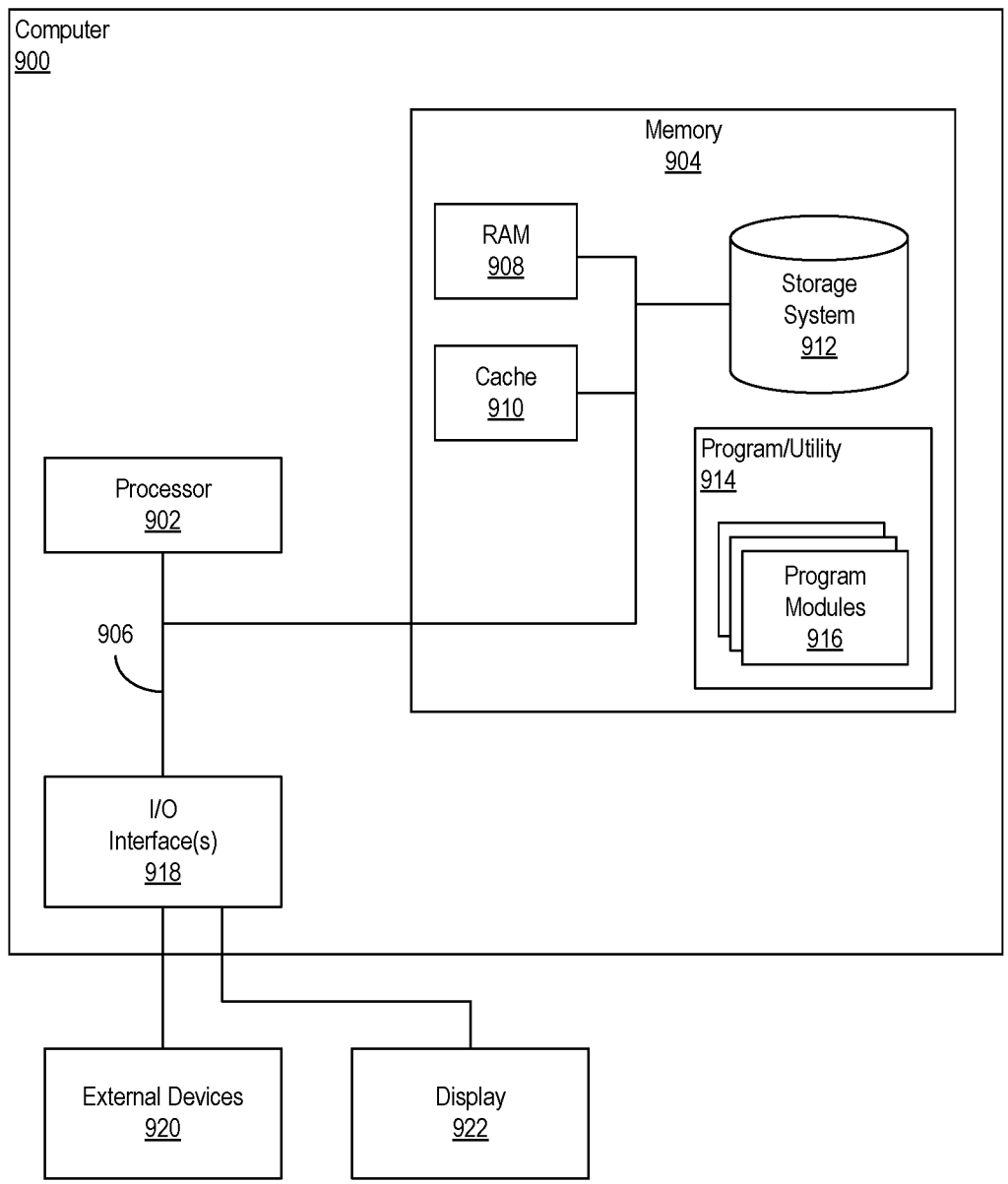
FIG. 9 illustrates an example of a data processing system for use with the inventive arrangements described herein.

FIG. 9 illustrates an example implementation of a computer 900. The components of computer 900 can include, but are not limited to, a processor 902, a memory 904, and a bus 906 that couples various system components including memory 904 to processor 902. Processor 902 may be implemented as one or more processors. In an example, processor 902 is implemented as a central processing unit (CPU). Example processor types include, but are not limited to, processors having an x86 type of architecture (IA-32, IA-64, etc.), Power Architecture, ARM processors, and the like.

Bus 906 represents one or more of any of a variety of communication bus structures. By way of example, and not limitation, bus 906 may be implemented as a Peripheral Component Interconnect Express (PCIe) bus. Computer 900 typically includes a variety of computer system readable media. Such media may include computer-readable volatile and non-volatile media and computer-readable removable and non-removable media.

In the example of FIG. 9, computer 900 includes memory 904. Memory 904 can include computer-readable media in the form of volatile memory, such as random-access memory (RAM) 908 and/or cache memory 910. Computer 900 also can include other removable/non-removable, volatile/non-volatile computer storage media. By way of example, storage system 912 can be provided for reading from and writing to a non-removable, non-volatile magnetic and/or solid-state media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 906 by one or more data media interfaces. Memory 904 is an example of at least one computer program product.

Program/utility 914, having a set (at least one) of program modules 916, may be stored in memory 904. By way of example, program modules 916 may represent an operating system, one or more application programs, other program modules, and program data. Program modules 916 generally carry out the functions and/or methodologies of the example implementations described within this disclosure. For example, one or more of program modules 916 can implement EDA software capable of performing the various operations described within this disclosure upon execution by computer 900.

Program/utility 914 is executable by processor 902. Program/utility 914 and any data items used, generated, and/or operated upon by computer 900 are functional data structures that impart functionality when employed by computer 900.

Computer 900 may include one or more Input/Output (I/O) interfaces 918 communicatively linked to bus 906. I/O interface(s) 918 allow computer 900 to communicate with one or more external devices 920 and/or communicate over one or more networks such as a local area network (LAN), a wide area network (WAN), and/or a public network (e.g., the Internet). Examples of I/O interfaces 918 may include, but are not limited to, network cards, modems, network adapters, hardware controllers, etc. Examples of external devices also may include a display 922 and/or other devices such as a keyboard and/or a pointing device that enable a user to interact with computer 900.

Computer 900 is only one example implementation of a computer. Computer 900 can be practiced as a standalone device (e.g., as a user computing device or a server, as a bare metal server), in a cluster (e.g., two or more interconnected computers), or in a distributed cloud computing environment (e.g., as a cloud computing node) where tasks are performed by remote processing devices that are linked through a communications network. In a distributed cloud computing environment, program modules may be located in both local and remote computer system storage media including memory storage devices. The example of FIG. 9 is not intended to suggest any limitation as to the scope of use or functionality of example implementations described herein. Computer 900 is an example of a data processing system and/or computer hardware that is capable of performing the various operations described within this disclosure.

In this regard, computer 900 may include fewer components than shown or additional components not illustrated in FIG. 9 depending upon the particular type of device and/or system that is implemented. The particular operating system and/or application(s) included may vary according to device and/or system type as may the types of I/O devices included. Further, one or more of the illustrative components may be incorporated into, or otherwise form a portion of, another component. For example, a processor may include at least some memory.

Computer 900 may be operational with numerous other general-purpose or special-purpose computing system environments or configurations. Examples of computing systems, environments, and/or configurations that may be suitable for use with computer 900 include, but are not limited to, personal computer systems, server computer systems, thin clients, thick clients, hand-held or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like.

Some computing environments, e.g., cloud computing environments and/or edge computing environments using computer 900 or other suitable data processing system, generally support the FPGA-as-a-Service (FaaS) model. In the FaaS model, user functions are hardware accelerated as circuit designs implemented within programmable ICs operating under control of the (host) data processing system. Other examples of cloud computing models are described in the National Institute of Standards and Technology (NIST) and, more particularly, the Information Technology Laboratory of NIST.

Figure 10:
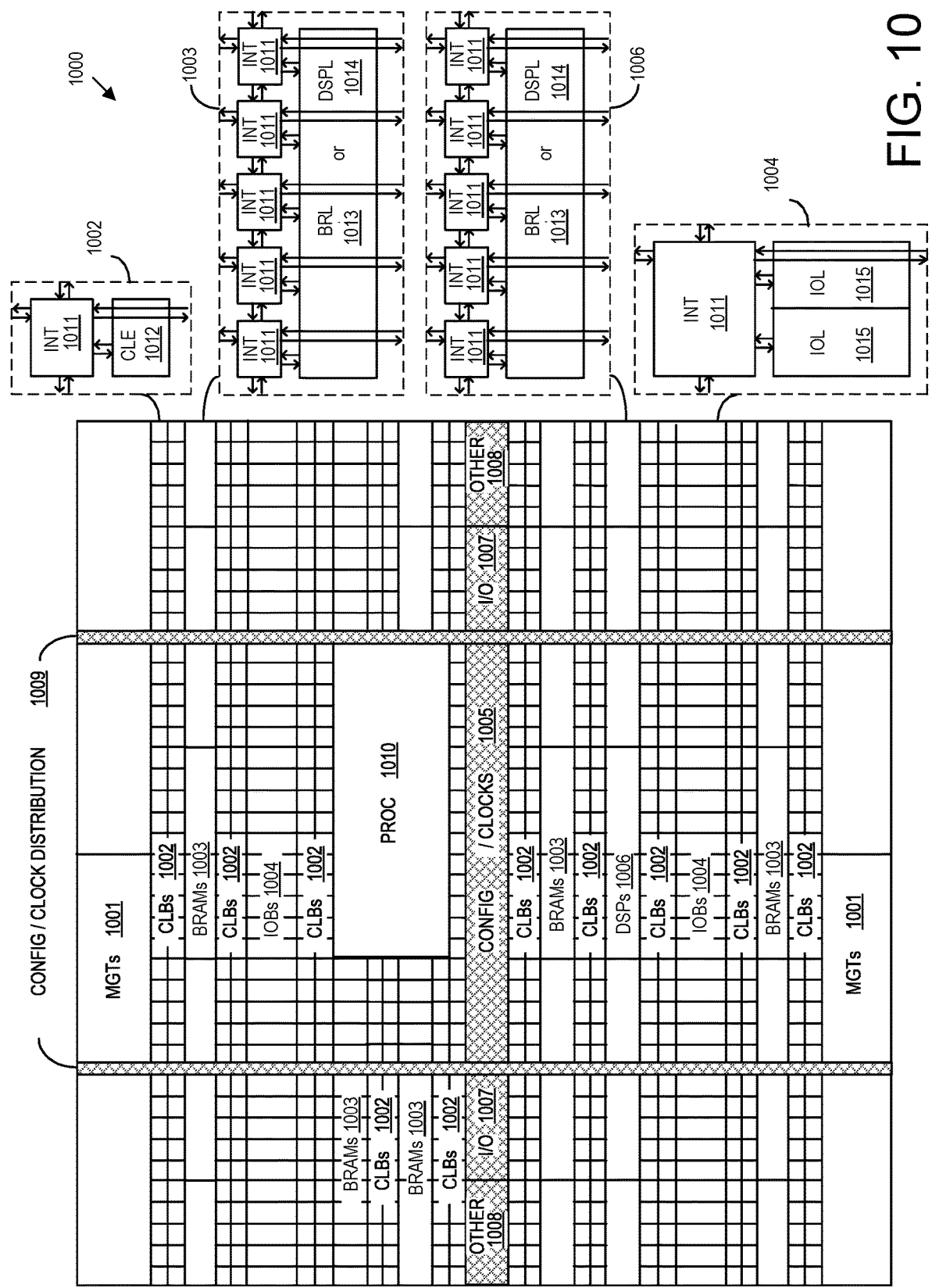
FIG. 10 illustrates an example architecture for an integrated circuit (IC).

FIG. 10 illustrates an example architecture 1000 for an IC. In one aspect, architecture 1000 may be implemented within a programmable IC. A programmable IC is an IC with at least some programmable circuitry. Programmable circuitry may include programmable logic. For example, architecture 1000 may be used to implement a field programmable gate array (FPGA). Architecture 1000 may also be representative of a system-on-chip (SoC) type of IC. An example of an SoC is an IC that includes a processor that executes program code and one or more other circuits. The other circuits may be implemented as hardwired circuitry, programmable circuitry, and/or a combination thereof. The circuits may operate cooperatively with one another and/or with the processor.

As shown, architecture 1000 includes several different types of programmable circuit, e.g., logic, blocks. For example, architecture 1000 may include a large number of different programmable tiles including multi-gigabit transceivers (MGTs) 1001, configurable logic blocks (CLBs) 1002, random-access memory blocks (BRAMs) 1003, input/output blocks (IOBs) 1004, configuration and clocking logic (CONFIG/CLOCKS) 1005, digital signal processing blocks (DSPs) 1006, specialized I/O blocks 1007 (e.g., configuration ports and clock ports), and other programmable logic 1008 such as digital clock managers, analog-to-digital converters, system monitoring logic, and so forth.

In some ICs, each programmable tile includes a programmable interconnect element (INT) 1011 having standardized connections to and from a corresponding INT 1011 in each adjacent tile. Therefore, INTs 1011, taken together, implement the programmable interconnect structure for the illustrated IC. Each INT 1011 also includes the connections to and from the programmable logic element within the same tile, as shown by the examples included at the right of FIG. 10.

For example, a CLB 1002 may include a configurable logic element (CLE) 1012 that may be programmed to implement user logic plus a single INT 1011. A BRAM 1003 may include a BRAM logic element (BRL) 1013 in addition to one or more INTs 1011. Typically, the number of INTs 1011 included in a tile depends on the height of the tile. As pictured, a BRAM tile has the same height as five CLBs, but other numbers (e.g., four) also may be used. A DSP tile 1006 may include a DSP logic element (DSPL) 1014 in addition to an appropriate number of INTs 1011. An 10B 1004 may include, for example, two instances of an I/O logic element (IOL) 1015 in addition to one instance of an INT 1011. The actual I/O pads connected to IOL 1015 may not be confined to the area of IOL 1015.

In the example pictured in FIG. 10, the shaded area near the center of the die, e.g., formed of regions 1005, 1007, and 1008, may be used for configuration, clock, and other control logic. Shaded areas 1009 may be used to distribute the clocks and configuration signals across the breadth of the programmable IC.

Some ICs utilizing the architecture illustrated in FIG. 10 include additional logic blocks that disrupt the regular columnar structure making up a large part of the IC. The additional logic blocks may be programmable blocks and/or dedicated circuitry. For example, a processor block depicted as PROC 1010 spans several columns of CLBs and BRAMs.

In one aspect, PROC 1010 may be implemented as dedicated circuitry, e.g., as a hardwired processor, that is fabricated as part of the die that implements the programmable circuitry of the IC. PROC 1010 may represent any of a variety of different processor types and/or systems ranging in complexity from an individual processor, e.g., a single core capable of executing program code, to an entire processor system having one or more cores, modules, co-processors, interfaces, or the like.

In another aspect, PROC 1010 may be omitted from architecture 1000 and replaced with one or more of the other varieties of the programmable blocks described. Further, such blocks may be utilized to form a "soft processor" in that the various blocks of programmable circuitry may be used to form a processor that can execute program code as is the case with PROC 1010.

The phrase "programmable circuitry" refers to programmable circuit elements within an IC, e.g., the various programmable or configurable circuit blocks or tiles described herein, as well as the interconnect circuitry that selectively couples the various circuit blocks, tiles, and/or elements according to configuration data that is loaded into the IC. For example, circuit blocks shown in FIG. 10 that are external to PROC 1010 such as CLBs 1002 and BRAMs 1003 are considered programmable circuitry of the IC.

In general, the functionality of programmable circuitry is not established until configuration data is loaded into the IC. A set of configuration bits may be used to program programmable circuitry of an IC such as an FPGA. The configuration bit(s) typically are referred to as a "configuration bitstream." In general, programmable circuitry is not operational or functional without first loading a configuration bitstream into the IC. The configuration bitstream effectively implements a particular circuit design within the programmable circuitry. The circuit design specifies, for example, functional aspects of the programmable circuit blocks and physical connectivity among the various programmable circuit blocks.

Circuitry that is "hardwired" or "hardened," i.e., not programmable, is manufactured as part of the IC. Unlike programmable circuitry, hardwired circuitry or circuit blocks are not implemented after the manufacture of the IC through the loading of a configuration bitstream. Hardwired circuitry is generally considered to have dedicated circuit blocks and interconnects, for example, that are functional without first loading a configuration bitstream into the IC, e.g., PROC 1010.

In some instances, hardwired circuitry may have one or more operational modes that can be set or selected according to register settings or values stored in one or more memory elements within the IC. The operational modes may be set, for example, through the loading of a configuration bitstream into the IC. Despite this ability, hardwired circuitry is not considered programmable circuitry as the hardwired circuitry is operable and has a particular function when manufactured as part of the IC.

In the case of an SoC, the configuration bitstream may specify the circuitry that is to be implemented within the programmable circuitry and the program code that is to be executed by PROC 1010 or a soft processor. In some cases, architecture 1000 includes a dedicated configuration processor that loads the configuration bitstream to the appropriate configuration memory and/or processor memory. The dedicated configuration processor does not execute user-specified program code. In other cases, architecture 1000 may utilize PROC 1010 to receive the configuration bitstream, load the configuration bitstream into appropriate configuration memory, and/or extract program code for execution.

FIG. 10 is intended to illustrate an example architecture that may be used to implement an IC that includes programmable circuitry, e.g., a programmable fabric. For example, the number of logic blocks in a column, the relative width of the columns, the number and order of columns, the types of logic blocks included in the columns, the relative sizes of the logic blocks, and the interconnect/logic implementations included at the right of FIG. 10 are purely illustrative. In an actual IC, for example, more than one adjacent column of CLBs is typically included wherever the CLBs appear, to facilitate the efficient implementation of a user circuit design. The number of adjacent CLB columns, however, may vary with the overall size of the IC. Further, the size and/or positioning of blocks such as PROC 1010 within the IC are for purposes of illustration only and are not intended as limitations.

A system as described herein in connection with FIGS. 1 and 9, for example, is capable of further processing a circuit design having undergone the processing described herein for implementation within an IC having an architecture the same as or similar to that of FIG. 10. The system, for example, is capable of synthesizing, placing, and routing the circuit design. The system may also perform bitstream generation so that the bitstream may be loaded into the IC, thereby physically implementing the circuit design within the IC.

In one or more other example implementations, the circuit design generated as described herein may be implemented in other types of ICs including Application-Specific ICs (ASICS), System-on-Chips (SoCs), and/or other hardwired ICs.

While the disclosure concludes with claims defining novel features, it is believed that the various features described within this disclosure will be better understood from a consideration of the description in conjunction with the drawings. The process(es), machine(s), manufacture(s) and any variations thereof described herein are provided for purposes of illustration. Specific structural and functional details described within this disclosure are not to be interpreted as limiting, but merely as a basis for the claims and as a representative basis for teaching one skilled in the art to variously employ the features described in virtually any appropriately detailed structure. Further, the terms and phrases used within this disclosure are not intended to be limiting, but rather to provide an understandable description of the features described.

For purposes of simplicity and clarity of illustration, elements shown in the figures have not necessarily been drawn to scale. For example, the dimensions of some of the elements may be exaggerated relative to other elements for clarity. Further, where considered appropriate, reference numbers are repeated among the figures to indicate corresponding, analogous, or like features.

As defined herein, the singular forms "a," "an," and "the" are intended to include the plural forms as well, unless the context clearly indicates otherwise.

As defined herein, the terms "at least one," "one or more," and "and/or," are open-ended expressions that are both conjunctive and disjunctive in operation unless explicitly stated otherwise. For example, each of the expressions "at least one of A, B, and C," "at least one of A, B, or C," "one or more of A, B, and C," "one or more of A, B, or C," and "A, B, and/or C" means A alone, B alone, C alone, A and B together, A and C together, B and C together, or A, B and C together.

As defined herein, the term "automatically" means without human intervention. As defined herein, the term "user" means a human being.

As used herein, the term "cloud computing" refers to a computing model that facilitates convenient, on-demand network access to a shared pool of configurable computing resources such as networks, servers, storage, applications, ICs (e.g., programmable ICs) and/or services. These computing resources may be rapidly provisioned and released with minimal management effort or service provider interaction. Cloud computing promotes availability and may be characterized by on-demand self-service, broad network access, resource pooling, rapid elasticity, and measured service.

As defined herein, the term "computer readable storage medium" means a storage medium that contains or stores program code for use by or in connection with an instruction execution system, apparatus, or device. As defined herein, a "computer readable storage medium" is not a transitory, propagating signal per se. A computer readable storage medium may be, but is not limited to, an electronic storage device, a magnetic storage device, an optical storage device, an electromagnetic storage device, a semiconductor storage device, or any suitable combination of the foregoing. The various forms of memory, as described herein, are examples of computer readable storage media. A non-exhaustive list of more specific examples of a computer readable storage medium may include: a portable computer diskette, a hard disk, a RAM, a read-only memory (ROM), an erasable programmable read-only memory (EPROM or Flash memory), an electronically erasable programmable read-only memory (EEPROM), a static random-access memory (SRAM), a portable compact disc read-only memory (CD-ROM), a digital versatile disk (DVD), a memory stick, a floppy disk, or the like.

As defined within this disclosure, the term "data structure" means a physical implementation of a data within a physical memory. As such, a data structure is formed of specific electrical or magnetic structural elements in a memory. A data structure imposes physical organization on the data stored in the memory as used by an application program executed using a processor.

As defined herein, the term "if" means "when" or "upon" or "in response to" or "responsive to," depending upon the context. Thus, the phrase "if it is determined" or "if [a stated condition or event] is detected" may be construed to mean "upon determining" or "in response to determining" or "upon detecting [the stated condition or event]" or "in response to detecting [the stated condition or event]" or "responsive to detecting [the stated condition or event]" depending on the context.

As defined herein, the term "responsive to" and similar language as described above, e.g., "if," "when," or "upon," means responding or reacting readily to an action or event. The response or reaction is performed automatically. Thus, if a second action is performed "responsive to" a first action, there is a causal relationship between an occurrence of the first action and an occurrence of the second action. The term "responsive to" indicates the causal relationship.

As defined herein, "data processing system" means one or more hardware systems configured to process data, each hardware system including at least one processor programmed to initiate operations and memory.

As defined herein, the term "processor" means at least one circuit capable of carrying out instructions contained in program code. The circuit may be an integrated circuit or embedded in an integrated circuit.

As defined herein, the term "output" means storing in physical memory elements, e.g., devices, writing to display or other peripheral output device, sending or transmitting to another system, exporting, or the like.

As defined herein, the term "substantially" means that the recited characteristic, parameter, or value need not be achieved exactly, but that deviations or variations, including for example, tolerances, measurement error, measurement accuracy limitations, and other factors known to those of skill in the art, may occur in amounts that do not preclude the effect the characteristic was intended to provide.

The terms first, second, etc. may be used herein to describe various elements. These elements should not be limited by these terms, as these terms are only used to distinguish one element from another unless stated otherwise or the context clearly indicates otherwise.

A computer program product may include a computer readable storage medium (or media) having computer readable program instructions thereon for causing a processor to carry out aspects of the inventive arrangements described herein. Within this disclosure, the term "program code" is used interchangeably with the term "computer readable program instructions." Computer readable program instructions described herein may be downloaded to respective computing/processing devices from a computer readable storage medium or to an external computer or external storage device via a network, for example, the Internet, a LAN, a WAN and/or a wireless network. The network may include copper transmission cables, optical transmission fibers, wireless transmission, routers, firewalls, switches, gateway computers and/or edge devices including edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations for the inventive arrangements described herein may be assembler instructions, instruction-set-architecture (ISA) instructions, machine instructions, machine dependent instructions, microcode, firmware instructions, or either source code or object code written in any combination of one or more programming languages, including an object oriented programming language and/or procedural programming languages. Computer readable program instructions may include state-setting data. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a LAN or a WAN, or the connection may be made to an external computer (for example, through the Internet using an Internet Service Provider). In some cases, electronic circuitry including, for example, programmable logic circuitry, an FPGA, or a PLA may execute the computer readable program instructions by utilizing state information of the computer readable program instructions to personalize the electronic circuitry, in order to perform aspects of the inventive arrangements described herein.

Certain aspects of the inventive arrangements are described herein with reference to flowchart illustrations and/or block diagrams of methods, apparatus (systems), and computer program products. It will be understood that each block of the flowchart illustrations and/or block diagrams, and combinations of blocks in the flowchart illustrations and/or block diagrams, may be implemented by computer readable program instructions, e.g., program code.

These computer readable program instructions may be provided to a processor of a computer, special-purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the operations specified in the flowchart and/or block diagram block or blocks.

The computer readable program instructions may also be loaded onto a computer, other programmable data processing apparatus, or other device to cause a series of operations to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various aspects of the inventive arrangements. In this regard, each block in the flowchart or block diagrams may represent a module, segment, or portion of instructions, which comprises one or more executable instructions for implementing the specified operations.

In some alternative implementations, the operations noted in the blocks may occur out of the order noted in the figures. For example, two blocks shown in succession may be executed substantially concurrently, or the blocks may sometimes be executed in the reverse order, depending upon the functionality involved. In other examples, blocks may be performed generally in increasing numeric order while in still other examples, one or more blocks may be performed in varying order with the results being stored and utilized in subsequent or other blocks that do not immediately follow. It will also be noted that each block of the block diagrams and/or flowchart illustration, and combinations of blocks in the block diagrams and/or flowchart illustration, may be implemented by special purpose hardware-based systems that perform the specified functions or acts or carry out combinations of special purpose hardware and computer instructions.

What is claimed is:

1. A method, comprising:
   detecting, using computer hardware, a loop construct contained in a function within a design specified in a high-level programming language;
   extracting, using the computer hardware, the loop construct from the function into a newly generated function of the design;
   generating, using the computer hardware, a state transition graph corresponding to the loop construct, wherein the state transition graph includes a function entry state, a loop region, and a function exit state;
   pruning, using the computer hardware, the state transition graph by relocating operations from the function entry state and the function exit state into the loop region; and
   generating, using the computer hardware, a circuit design defining a pipeline hardware architecture implementing the loop construct based, at least in part, on the pruned state transition graph, wherein the pipeline hardware architecture includes a pipeline circuit and a control circuit encapsulated and separate from the pipeline circuit, and wherein the control circuit implements a first predetermined interface with circuitry external to the pipeline hardware architecture and a second predetermined interface with the pipeline circuit.

2. The method of claim 1, wherein the detecting comprises first generating an intermediate representation of the design.

3. The method of claim 1, wherein the pruning includes:
   prepending the function entry state prior to a first state of the loop region.

4. The method of claim 1, wherein the pruning includes:
   relocating operations of the function entry state of the state transition graph to a first state of the loop region; and
   removing the function entry state from the state transition graph.

5. The method of claim 1, wherein the pruning includes:
   relocating operations of the function exit state of the state transition graph to a pipeline exit state of the loop region; and
   removing the function exit state from the state transition graph.

6. The method of claim 5, wherein the pruning includes:
   detecting loop exit and loop iteration state transitions and separating the loop exit and the loop iteration state transitions from the loop region.

7. The method of claim 6, wherein the control circuit implements the loop exit and loop iteration state transitions and the pipeline circuit operates under control of the control circuit, wherein the pipeline circuit implements the loop region.

8. A system, comprising:
a processor configured to initiate operations including:
- detecting a loop construct contained in a function within a design specified in a high-level programming language;
- extracting the loop construct from the function into a newly generated function of the design;
- generating a state transition graph corresponding to the loop construct, wherein the state transition graph includes a function entry state, a loop region, and a function exit state;
- pruning the state transition graph by selectively relocating operations among states of the state transition graph; and
- generating a circuit design defining a pipeline hardware architecture implementing the loop construct based, at least in part, on the pruned state transition graph, wherein the pipeline hardware architecture includes a pipeline circuit and a control circuit encapsulated and separate from the pipeline circuit, and wherein the control circuit implements a first predetermined interface with circuitry external to the pipeline hardware architecture and a second predetermined interface with the pipeline circuit.

9. The system of claim 8, wherein the detecting comprises first generating an intermediate representation of the design.

10. The system of claim 8, wherein the pruning includes:
prepending the function entry state prior to a first state of the loop region.

11. The system of claim 10, wherein the pruning includes:
- relocating operations of the function entry state of the state transition graph to a first state of the loop region; and
- removing the function entry state from the state transition graph.

12. The system of claim 11, wherein the pruning includes:
- relocating operations of the function exit state of the state transition graph to a pipeline exit state of the loop region; and
- removing the function exit state from the state transition graph.

13. The system of claim 12, wherein the pruning includes:
detecting loop exit and loop iteration state transitions and separating the loop exit and the loop iteration state transitions from the loop region.

14. The system of claim 13, wherein the control circuit implements the loop exit and loop iteration state transitions and the pipeline circuit operates under control of the control circuit, wherein the pipeline circuit implements the loop region.

15. A computer program product, comprising:
one or more non-transitory computer readable storage media, and program instructions collectively stored on the one or more computer readable storage media, wherein the program instructions are executable by computer hardware to initiate operations including:
- detecting a loop construct contained in a function within a design specified in a high-level programming language;
- extracting the loop construct from the function into a newly generated function of the design;
- generating a state transition graph corresponding to the loop construct, wherein the state transition graph includes a function entry state, a loop region, and a function exit state;
- pruning the state transition graph by selectively relocating operations among states of the state transition graph; and
- generating a circuit design defining a pipeline hardware architecture implementing the loop construct based, at least in part, on the pruned state transition graph, wherein the pipeline hardware architecture includes a pipeline circuit and a control circuit encapsulated and separate from the pipeline circuit, and wherein the control circuit implements a first predetermined interface with circuitry external to the pipeline hardware architecture and a second predetermined interface with the pipeline circuit.

16. The computer program product of claim 15, wherein the pruning includes:
prepending the function entry state prior to a first state of the loop region.

17. The computer program product of claim 16, wherein the pruning includes:
- relocating operations of the function entry state of the state transition graph to a first state of the loop region;
- removing the function entry state from the state transition graph;
- relocating operations of the function exit state of the state transition graph to a pipeline exit state of the loop region; and
- removing the function exit state from the state transition graph.

18. The computer program product of claim 17, wherein the pruning includes:
- detecting loop exit and loop iteration state transitions and separating the loop exit and the loop iteration state transitions from the loop region; and
- wherein the pipeline hardware architecture includes a control circuit implementing the loop exit and loop iteration state transitions and a pipeline circuit operating under control of the control circuit, wherein the pipeline circuit implements the loop region.

* * * * *